(12) United States Patent
Mei et al.

(10) Patent No.: US 12,022,723 B2
(45) Date of Patent: Jun. 25, 2024

(54) METHOD FOR PATTERNING QUANTUM DOT LAYER, METHOD FOR MANUFACTURING LIGHT EMITTING DEVICE

(71) Applicant: BOE Technology Group Co., Ltd., Beijing (CN)

(72) Inventors: Wenhai Mei, Beijing (CN); Zhenqi Zhang, Beijing (CN); Zhihong Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/139,277

(22) Filed: Apr. 25, 2023

(65) Prior Publication Data

US 2023/0263040 A1 Aug. 17, 2023

Related U.S. Application Data

(63) Continuation of application No. 17/194,451, filed on Mar. 8, 2021, now Pat. No. 11,672,162.

(30) Foreign Application Priority Data

Jul. 9, 2020 (CN) .......................... 202010656714.3

(51) Int. Cl.
*H10K 71/00* (2023.01)
*H10K 50/115* (2023.01)
*H10K 71/20* (2023.01)
(52) U.S. Cl.
CPC ........... *H10K 71/00* (2023.02); *H10K 50/115* (2023.02); *H10K 71/20* (2023.02)

(58) Field of Classification Search
None
See application file for complete search history.

(56) References Cited

U.S. PATENT DOCUMENTS

2019/0312204 A1* 10/2019 Kang ..................... H10K 50/11
2020/0313037 A1* 10/2020 He ....................... C09K 11/883
2020/0343467 A1   10/2020 Li
(Continued)

OTHER PUBLICATIONS

U.S. Appl. No. 17/194,451 non-final office action dated Dec. 1, 2022.
(Continued)

*Primary Examiner* — Michelle Mandala
(74) *Attorney, Agent, or Firm* — IPro, PLLC

(57) ABSTRACT

A method of patterning quantum dot layer includes: forming, on a substrate, a film layer including a photosensitive material and quantum dots with ligands on surfaces of the quantum dots; irradiating a quantum dot reserved area with light of a preset wavelength; where under irradiation with light of the preset wavelength, the photosensitive material or a product of the photosensitive material after light irradiation reacts with the ligands on the surfaces of the quantum dots, to allow the ligands to fall off from the surfaces of the quantum dots, so that solubility of the quantum dots is changed to cause the quantum dots to undergo coagulation; and removing a portion of the film layer which is not irradiated by the light of the preset wavelength, to form a patterned quantum dot portion of the quantum dot layer in the quantum dot reserved area.

6 Claims, 7 Drawing Sheets

(56) References Cited

U.S. PATENT DOCUMENTS

| | | | |
|---|---|---|---|
| 2020/0393600 A1* | 12/2020 | Yu | G02F 1/133516 |
| 2021/0351244 A1 | 11/2021 | Asaoka et al. | |
| 2021/0359028 A1 | 11/2021 | Asaoka et al. | |
| 2021/0408423 A1* | 12/2021 | Kristal | H10K 71/13 |
| 2022/0310960 A1 | 9/2022 | Honda et al. | |
| 2022/0320191 A1 | 10/2022 | Yoshikawa et al. | |
| 2022/0328779 A1 | 10/2022 | Satoh et al. | |
| 2022/0359845 A1 | 11/2022 | Kobashi et al. | |

OTHER PUBLICATIONS

U.S. Appl. No. 17/194,451 notice of allowance dated Jan. 26, 2023.

* cited by examiner

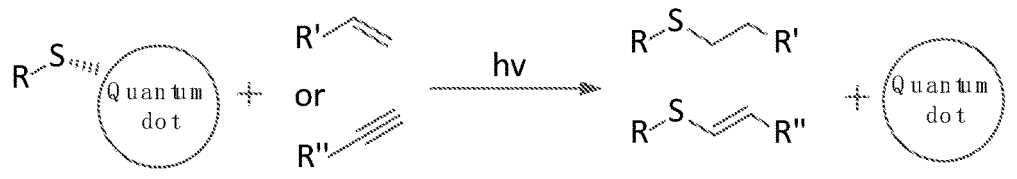
The ligand falls off, and the quantum dots are coagulated
FIG. 4
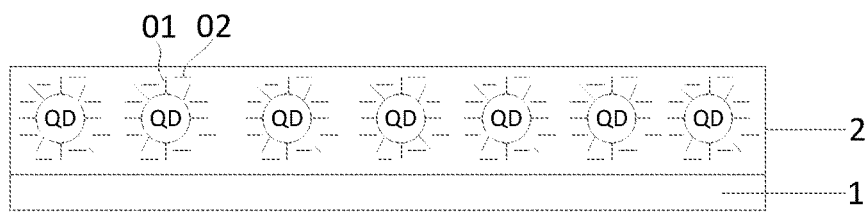
FIG. 5
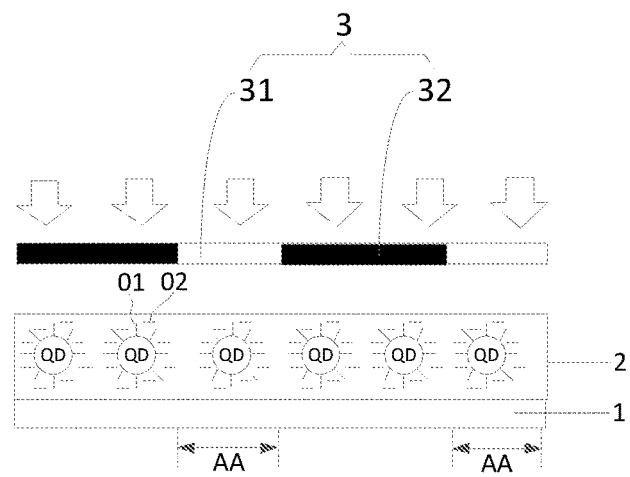
FIG. 6A
FIG. 6B

METHOD FOR PATTERNING QUANTUM DOT LAYER, METHOD FOR MANUFACTURING LIGHT EMITTING DEVICE

CROSS REFERENCE TO RELATED APPLICATIONS

This application is a continuation application of U.S. patent application Ser. No. 17/194,451, filed on Mar. 8, 2021, which is based on and claims priority under 35 U.S.C 119 to Chinese Patent Application No. 202010656714.3, filed on Jul. 9, 2020, in the China National Intellectual Property Administration. The entire disclosure of the above application is incorporated herein by reference.

FIELD

The disclosure relates to the technical field of display, in particular to a method for patterning a quantum dot layer, a method for manufacturing a light emitting device, and related devices.

BACKGROUND

Along with the in-depth development of quantum dot preparation technology, continuous improvement of the stability of quantum dots and luminous efficiency, and continuous deepening of the research on quantum light emitting diode (QLED), the application prospects of the QLED in the display field are increasingly bright. However, the generation efficiency of the QLED at present has not yet reached the mass production level.

Quantum dots are zero-dimensional nanoscale semiconductor materials, and the sizes of quantum dots in all the three dimensions are no larger than twice the Bohr radius of excitons of the corresponding semiconductor materials. When patterned quantum dots are manufactured in the related art, due to the inorganic nanoparticle properties of quantum dots, the patterned quantum dots cannot be manufactured through evaporation filming and patterning.

Therefore, quantum dots with high resolution and favorable performance cannot be manufactured in the related art.

SUMMARY

Embodiments of the disclosure provide a method for patterning a quantum dot layer and a method for manufacturing a light emitting device.

Embodiments of the present disclosure provide a method for patterning a quantum dot layer, including: forming, on a substrate, a film layer including a photosensitive material and quantum dots with ligands on surfaces of the quantum dots; irradiating a quantum dot reserved area with light of a preset wavelength; where under irradiation with light of the preset wavelength, the photosensitive material or a product of the photosensitive material after light irradiation reacts with the ligands on the surfaces of the quantum dots, to allow the ligands to fall off from the surfaces of the quantum dots, so that solubility of the quantum dots is changed to cause the quantum dots to undergo coagulation; and removing a portion of the film layer which is not irradiated by the light of the preset wavelength, to form a patterned quantum dot portion of the quantum dot layer in the quantum dot reserved area.

Embodiments of the present disclosure further provide a method for manufacturing a light emitting device, including forming an anode, a quantum dot layer and a cathode. The quantum dot layer is formed through the above method for patterning the quantum dot layer.

BRIEF DESCRIPTION OF THE DRAWINGS

FIG. 4 is a schematic diagram of a mechanism of the reaction between another photosensitive material and a ligand on the surface of the quantum dots according to some embodiments of the disclosure.

FIG. 5 is another flow chart of a manufacturing method of patterning a quantum dot layer according to some embodiments of the disclosure.

FIG. 6A to FIG. 6L are structural schematic diagrams illustrate the structures after each step of a manufacturing method of patterning a quantum dot layer according to some embodiments of the disclosure is performed.

DETAILED DESCRIPTION OF THE EMBODIMENTS

In order to make the objective, technical solutions and advantages of the present disclosure clearer, a detailed description will be given below on the specific embodiments of the method for patterning a quantum dot layer, the method for manufacturing the light emitting devices and related devices according to some embodiments of the disclosure in combination with accompanying drawings below.

The embodiments described below with reference to accompanying drawings are merely used for explaining the present disclosure, and cannot be construed as a limitation to the present disclosure.

Figure 1:
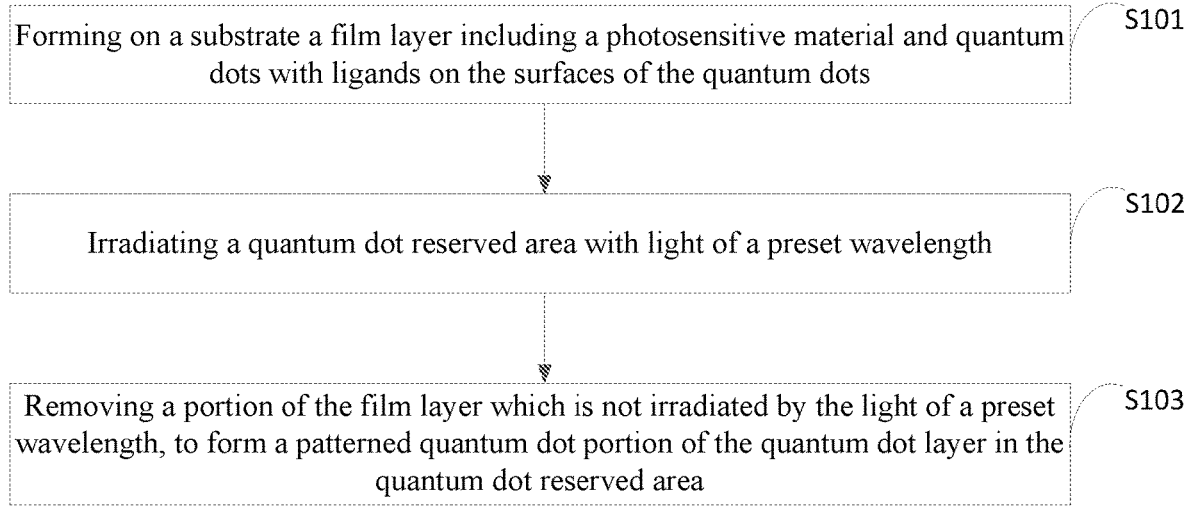
FIG. 1 is a flow chart of a manufacturing method of patterning a quantum dot layer according to some embodiments of the disclosure.

Embodiments of the present disclosure provide a method for patterning a quantum dot layer, as shown in FIG. 1, including:

S101, forming, on a substrate, a film layer including a photosensitive material and quantum dots with ligands on the surface;

S102, irradiating a quantum dot reserved area with light of a preset wavelength; where under irradiation with light of a preset wavelength, the photosensitive material or a product of the photosensitive material after light irradiation reacts with the ligand on the surface of the quantum dots, such that the ligand falls off from the surface of the quantum dots, to change the solubility of the quantum dots, and cause the quantum dots to undergo coagulation; and S103, removing the portion of the film layer which is not irradiated by the light of a preset wavelength, to form a patterned quantum dot portion of the quantum dot layer in the quantum dot reserved area.

It should be noted that, the quantum dot layer may include one or more patterned quantum dot portion(s). In some embodiments, if the quantum dot layer is used for RGB-based display, the quantum dot layer includes three quantum dot portions corresponding to R, G and B colors.

Based on the above method of patterning a quantum dot layer, in the present disclosure, firstly a film layer including a photosensitive material and quantum dots with ligands on the surface is formed on a substrate, then a quantum dot reserved area is irradiated with light of a preset wavelength. Since under irradiation with light of a preset wavelength, the photosensitive material or a product of the photosensitive material after light irradiation reacts with the ligand on the surface of the quantum dot, the ligand falls off from the surface of the quantum dots, the solubility of the quantum dots without a ligand is changed, such that the quantum dots are coagulated, and the quantum dots can no longer be dissolved in the original solvent. Finally, the portion of the film layer which is not irradiated by the light of a preset wavelength is removed to form a patterned quantum dot portion of the quantum dot layer in the quantum dot reserved area, i.e., the patterning of the quantum dot layer is completed. Compared with the related art, in the present disclosure, the patterning of the quantum dot layer can be achieved without ink-jet printing or photolithography, thereby forming quantum dots with high resolution and favorable performance.

In some embodiments, the light of a preset wavelength in the embodiments of the present disclosure can be an ultraviolet light of a preset wavelength.

Figure 2:
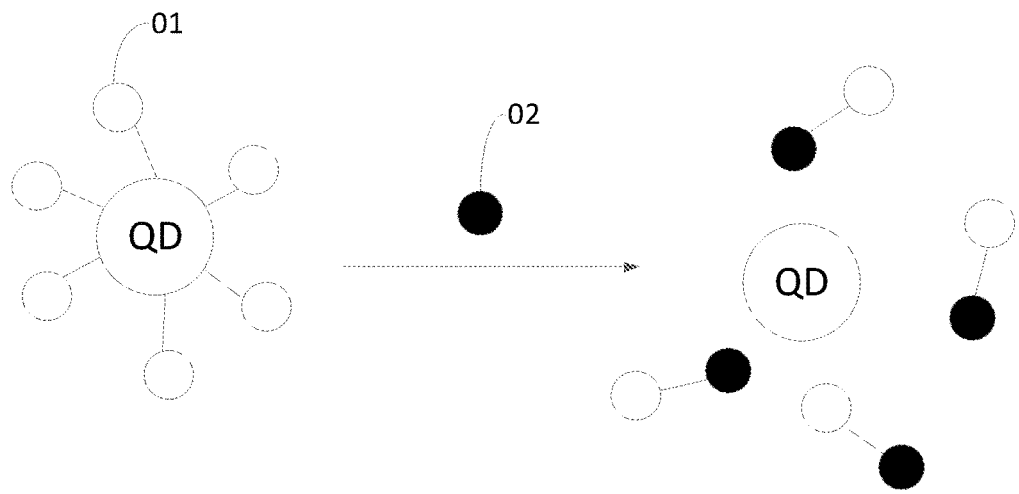
FIG. 2 is a schematic diagram illustrates principles for patterning quantum dots according to some embodiments of the disclosure.

In some embodiments, through adding a certain amount of photosensitive materials to the quantum dots and through irradiation with ultraviolet light of a preset wavelength, under irradiation of ultraviolet light of a preset wavelength, the photosensitive material can generate corresponding ions, groups or free radicals which can be tightly combined with the original ligand of the quantum dot, or the photosensitive material itself can react with the original ligand of the quantum dot, such that the ligand falls off from the surface of the quantum dot, and the quantum dot is insoluble in the original solvent due to a lack of ligand material, thereby causing coagulation of the quantum dots in the region irradiated by ultraviolet light, and achieving the purpose of patterning the quantum dot. In some embodiments, the patterning principle of the quantum dot is as shown in FIG. 2. In FIG. 2, QD represents quantum dot, 01 represents the ligand on the surface of the quantum dot, 02 represents the corresponding ions, groups or free radicals generated by the photosensitive material under irradiation with ultraviolet light of a preset wavelength or represents the photosensitive material itself. Under irradiation with ultraviolet light of a preset wavelength, 02 is combined with the ligand 01 on the surface of the quantum dot QD, such that the ligand 01 falls off from the surface of the quantum dot QD.

In some embodiments, in the photosensitive material according to some embodiments of the disclosure, different photosensitive materials can be added aiming at different types of ligands of quantum dots. The ligands on the surface of the quantum dots generally include oxygen-coordinated ligands, nitrogen-coordinated ligands, phosphine-coordinated ligands or sulfur-coordinated ligands. In some embodiments, the oxygen-coordinated ligand is generally carboxylate radical, the nitrogen-coordinated ligand is generally amino, the phosphine-coordinated ligand is generally phosphino, and the sulfur-coordinated ligand is generally sulfydryl. In some embodiments, on the surface of the quantum dots, the carboxylate ligand maybe oleic acid, the amino ligand maybe oleylamine, the phosphine ligand maybe tri-n-octylphosphine, and the sulfydryl ligand maybe 1-dodecanethiol.

In some embodiments, the photosensitive material generally includes the photo-acid generators, olefins or alkynes. When the ligand on the surface of the quantum dot is a carboxylate ligand, the doped photosensitive material can be diazonaphthoquinones, triazines, trifluorosulfonates, etc. When the ligand on the surface of the quantum dot is a sulfydryl ligand, the doped photosensitive material can be olefins and alkynes. Of course, the photosensitive material is not limited to photo-acid generators, olefins or alkynes, and corresponding photosensitive material can be selected according to the type of ligand on the surface of the quantum dot.

Figure 3:
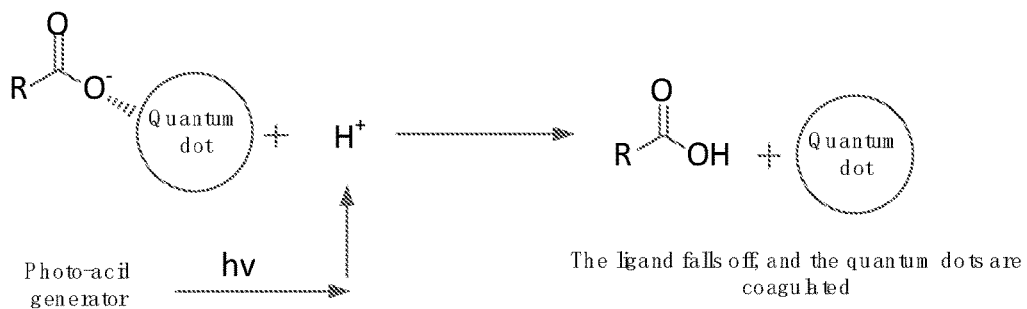
FIG. 3 is a schematic diagram illustrates a mechanism of the reaction between a photosensitive material and a ligand on the surface of the quantum dots according to some embodiments of the disclosure.

In some embodiments, when the ligand on the surface of the quantum dot is oleic acid (carboxylate radicals) ligand quantum dot, the quantum dot can be mixed with the acid-generating agent, hydrogen ions are generated after irradiation with ultraviolet light by utilizing the acid-generating agent, hydrogen ions can be combined with carboxylate radicals to generate carboxylic acid, therefore, the carboxylate ligand on the surface of the quantum dot falls off. The quantum dots are no longer soluble in the original solvent of the quantum dots, but are coagulated. The reaction mechanism of coagulation of the quantum dots of the carboxylate ligand is as shown in FIG. 3. In some embodiments, when the ligand on the surface of the quantum dot is 1-dodecanethiol (sulfydryl) ligand quantum dot, the quantum dot can be mixed with the olefin or alkyne, the sulfydryl performs click reaction with olefin or alkyne under irradiation of the ultraviolet light, such that the sulfydryl ligand on the surface of the quantum dot falls off and the quantum dots are no longer soluble in the original solvent of the quantum dots, but are coagulated. The reaction mechanism of coagulation of the quantum dots of the sulfydryl ligand is as shown in FIG. 4. In some embodiments, the ligand on the surface of the quantum dot can also be of other types, as long as a suitable photosensitive material which can react with the ligand on the surface of the quantum dot under irradiation of the ultraviolet light can be provided, and other types of ligands all fall within the protection scope of the present disclosure.

In some embodiments, the quantum dots include but are not limited to such quantum dots as CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, $CsPbI_3$/ZnS.

In some embodiments, in the above patterning method according to some embodiments of the disclosure, as to the removal of the portion of the film layer which is not irradiated with light of a preset wavelength, a solvent can be adopted to clean the film layer. The quantum dots in the area not irradiated with light in the film layer are dissolved in the solvent, and the coagulated quantum dots in the quantum dot reserved area are not dissolved in the solvent, therefore, a patterned quantum dot portion of the quantum dot layer can be formed in the quantum dot reserved area, and the method for removing quantum dots with solvent is more simple and feasible during actual production process and is low in production cost.

In some embodiments, when the film layer is cleaned with solvent, the residues except the coagulated quantum dots in the quantum dot reserved area can also be removed. For example, the photosensitive materials and the like which are not combined with the ligand on the surface of the quantum dot.

In some embodiments, to enable the quantum dots in the quantum dot layer to be coagulated tightly to form a pattern, after forming the quantum dot layer, the method further includes: drying and annealing the quantum dot layer.

The quantum dot layer after drying and annealing can be more tightly coagulated. During implementation, the process parameters for drying and annealing can be set according to actual production requirements.

To realize full-color display, the quantum dot layer generally includes patterned quantum dots of different colors. In some embodiments, with the quantum dot layer including a first quantum dot portion, a second quantum dot portion and a third quantum dot portion as an example. The method for patterning a quantum dot layer according to some embodiments of the disclosure is introduced in details in combination with accompanying drawings.

In some embodiments, in the above patterning method according to some embodiments of the disclosure, as shown in FIG. 5, the forming on a substrate a film layer including a photosensitive material and quantum dots with ligands on the surface includes:

S501, mixing the photosensitive material and first quantum dots with ligands on the surface to form a first mixed solution;

S502, coating the first mixed solution on the substrate to form a first film layer.

In some embodiments, as shown in FIG. 6A, the first mixed solution is coated on the substrate 1 by spin coating to form a first film layer 2. In FIG. 6A, QD represents the first quantum dot, 01 represents the ligand on the surface of the first quantum dot, and 02 represents a photosensitive material which is dispersed in the first mixed solution and which is not combined with the ligand 01.

In some embodiments, in the above patterning method, when the ligand on the surface of the quantum dot is a carboxylate ligand, the photosensitive material can be a photo-acid generator, then the mass of the photo-acid generator can account for 1%-20% of the mass of the above mixed solution. When the ligand on the surface of the quantum dot is a sulfydryl ligand, the photosensitive material can be olefins or alkynes, then the mass of the olefins or alkynes can be 1-20 times the mass of the mixed solution. In some embodiments, the content of the photosensitive material can be set according to actual requirements.

In some embodiments, as shown in FIG. 6B, the quantum dot reserved area AA is irradiated with light of a preset wavelength (as shown by the direction of the arrow in the figure), and the first quantum dot reserved area AA corresponds to the area in which the first quantum dot portion needs to be formed subsequently. In some embodiments, in the above patterning method, the first film layer 2 can be irradiated by ultraviolet light. When the first film layer 2 is irradiated, the first film layer 2 can be shielded with a mask 3. The mask 3 includes a light-transmitting area 31 and a light-shading area 32. The light-transmitting area 31 corresponds to the first quantum dot reserved area AA for receiving light irradiation in the first film layer 2.

Figure 6C:
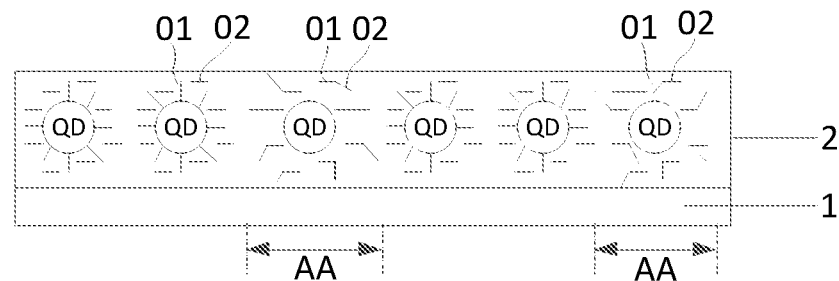

As shown in FIG. 6C, which shows that after the first film layer 2 is irradiated by ultraviolet light, the photosensitive material 02 in the first quantum dot reserved area AA is combined with the ligand 01 on the surface of the first quantum dot, and the ligand 01 falls off from the surface of the first quantum dot QD.

Figure 6D:
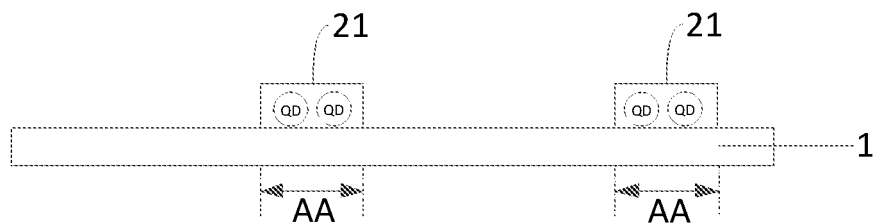

As shown in FIG. 6D, the first film layer 2 after light irradiation is cleaned with solvent (for example, methylbenzene), the quantum dots QD in the film layer 2 not irradiated with light of a preset wavelength and the residues except the coagulated quantum dots QD in the first quantum dot reserved area AA are all dissolved in the methylbenzene and washed away, while the quantum dots in the reserved area AA have no ligand 01 on the surface, and are not dissolved in methylbenzene and are coagulated. That is, the quantum dots QD coagulated in the first quantum dot reserved area AA form the patterned first quantum dot portion 21.

Figure 6E:
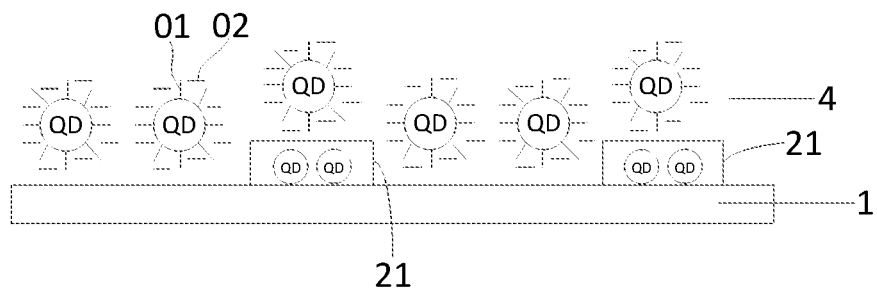

Afterwards, the photosensitive material and the second quantum dot with a ligand on the surface are mixed to form a second mixed solution, as shown in FIG. 6E. The second mixed solution is coated on the substrate 1 formed with a first quantum dot portion 21 through spin coating to form a second film layer 4. In FIG. 6E, QD represents the second quantum dot, 01 represents the ligand on the surface of the second quantum dot, and 02 represents a photosensitive material which is dispersed in the second mixed solution and which is not combined with the ligand 01.

Figure 6F:
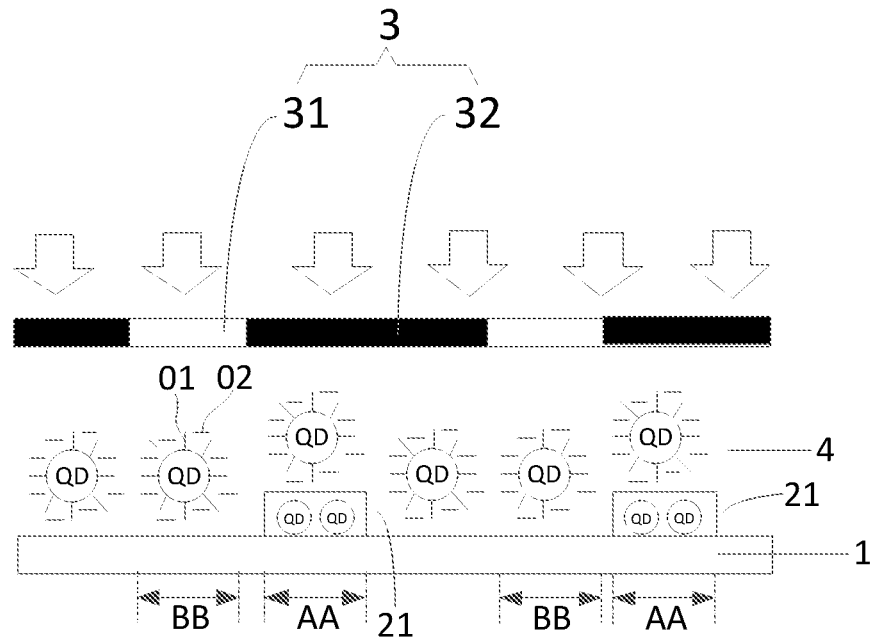

In some embodiments, as shown in FIG. 6F, the second quantum dot reserved area BB of the second film layer 4 is irradiated with light of a preset wavelength (as shown by the direction of the arrow in the figure), and the second quantum dot reserved area BB corresponds to the area in which the second quantum dot portion needs to be formed subsequently. In some embodiments, in the above patterning method, the second film layer 4 can be irradiated by ultraviolet light. When the second film layer 4 is irradiated, the second film layer 4 can be shielded with a mask 3, the mask 3 includes a light-transmitting area 31 and a light-shading area 32. The light-transmitting area 31 corresponds to the second quantum dot reserved area BB for receiving light irradiation in the second film layer 4.

Figure 6G:
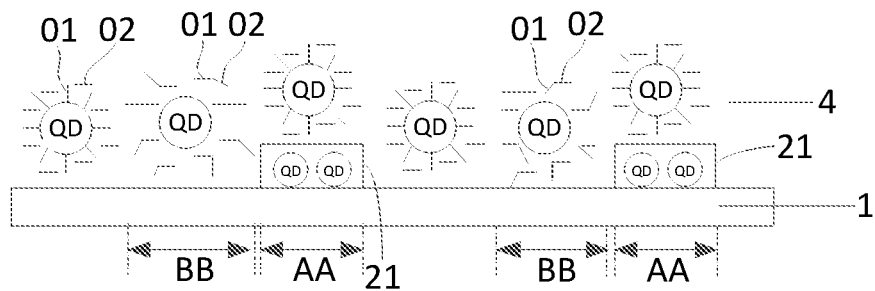

In some embodiments, as shown in FIG. 6G, after the second film layer 4 is irradiated by ultraviolet light, the photosensitive material 02 of the second quantum dot reserved area BB is combined with the ligand 01 on the surface of the second quantum dot, and the ligand 01 falls off from the surface of the second quantum dot.

Figure 6H:
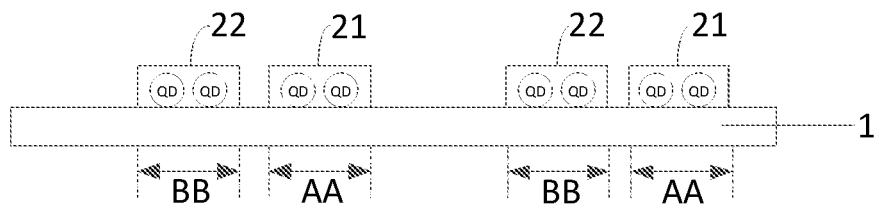

In some embodiments, as shown in FIG. 6H, the second film layer 4 after light irradiation is cleaned with solvent (for example, methylbenzene), the quantum dots in the second film layer not irradiated with light of a preset wavelength and the residues except the coagulated second quantum dots in the second quantum dot reserved area BB are all dissolved in the methylbenzene and washed away, while the quantum dots in the second quantum dot reserved area BB have no ligand 01 on the surface, and are not dissolved in methylbenzene and are coagulated. That is, the second quantum dots coagulated in the second quantum dot reserved area BB form the patterned second quantum dot portion 22.

Figure 6I:
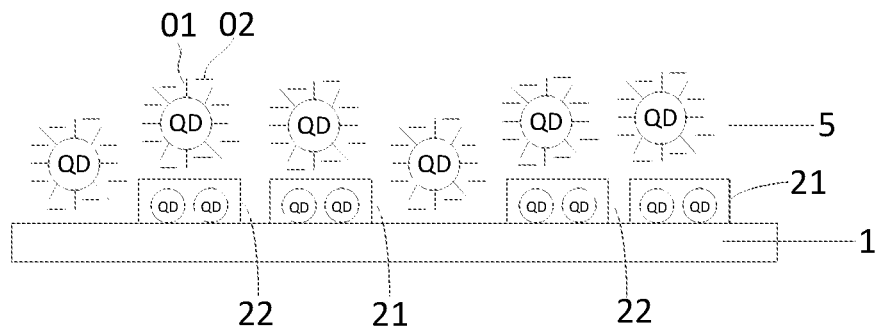

Finally, the photosensitive material and the third quantum dot with a ligand on the surface are mixed to form a third mixed solution, as shown in FIG. 6I, the third mixed solution is coated on the substrate 1 formed with a second quantum dot portion 22 through spin coating to form a third film layer 5. In FIG. 6I, QD represents the third quantum dot, 01 represents the ligand on the surface of the third quantum dot, and 02 represents a photosensitive material which is dispersed in the third mixed solution and which is not combined with the ligand 01.

Figure 6J:
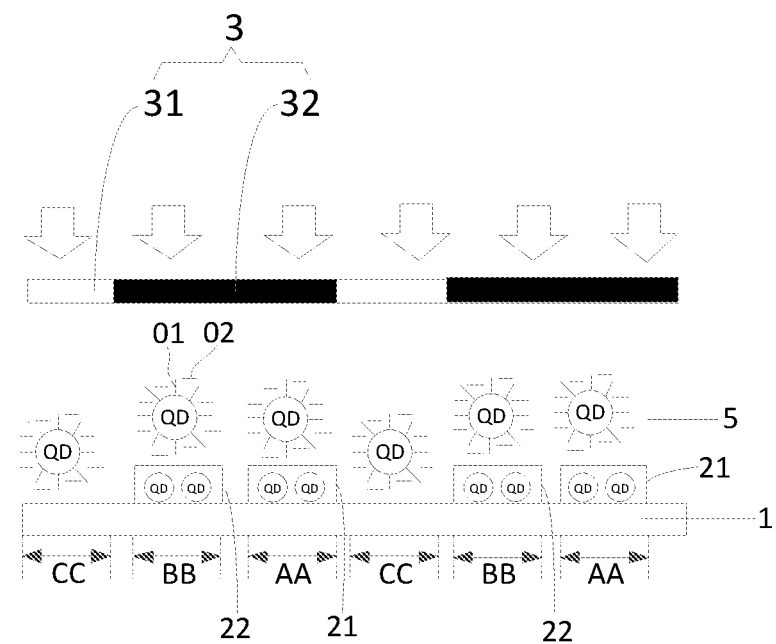

In some embodiments, as shown in FIG. 6J, the third quantum dot reserved area CC of the third film layer 5 is irradiated with light of a preset wavelength (as shown by the direction of the arrow in the figure), and the third quantum dot reserved area CC corresponds to the area in which the third quantum dot portion needs to be formed subsequently. In some embodiments, the third film layer 5 can be irradiated by ultraviolet light. When the third film layer 5 is irradiated, the third film layer 5 can be shielded with a mask 3. The mask 3 includes a light-transmitting area 31 and a light-shading area 32, and the light-transmitting area 31 corresponds to the third quantum dot reserved area CC for receiving light irradiation in the film layer 2.

Figure 6K:
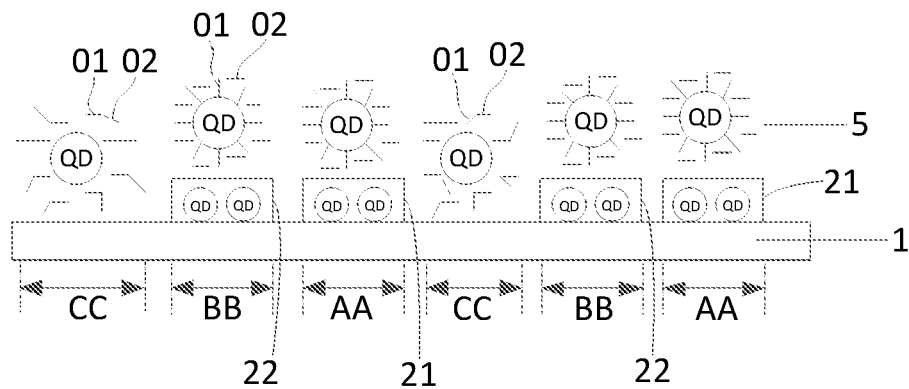

In some embodiments, as shown in FIG. 6K, after the third film layer 5 is irradiated by ultraviolet light, the photosensitive material 02 of the third quantum dot reserved area CC is combined with the ligand 01 on the surface of the third quantum dot, and the ligand 01 falls off from the surface of the third quantum dot.

Figure 6L:
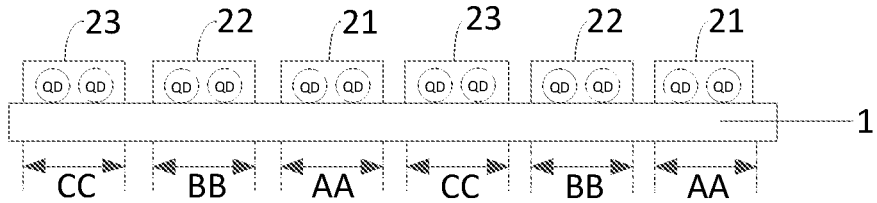

As shown in FIG. 6L, the third film layer 5 after light irradiation is cleaned with solvent (for example, methylbenzene), the third quantum dots in the third film layer 5 not irradiated with light of a preset wavelength and the residues except the coagulated third quantum dots in the third quantum dot reserved area CC are all dissolved in the methylbenzene and washed away, while the third quantum dots in the third quantum dot reserved area CC have no ligand 01 on the surface, and are not dissolved in methylbenzene and are coagulated. That is, the third quantum dots coagulated in the third quantum dot reserved area CC form the patterned third quantum dot portion 23.

In some embodiments, the light emitted by the first quantum dot portion, the light emitted by the second quantum dot portion and the light emitted by the third quantum dot portion are respectively red, green and blue. As such, the patterning process of full-color quantum dots is completed through the above patterning method without adopting inkjet printing or photolithography.

In some embodiments, when the light emitted by the first quantum dot portion is red, the wavelength of the adopted ultraviolet light can be 405 nm (H line); when the light emitted by the second quantum dot portion is green, the wavelength of the adopted ultraviolet light can be 365 nm (I line); and when the light emitted by the third quantum dot portion is blue, the wavelength of the adopted ultraviolet light can be 436 nm (G line).

In some embodiments, in the process of manufacturing the first quantum dot portion, the second quantum dot portion and the third quantum dot portion which emit light of different colors, the photosensitive materials can be the same and can also be different.

In some embodiments, when the ligand on the surface of the quantum dot is an oxygen-coordinated carboxylate ligand, then the same acid-generating agent or different acid-generating agents can be selected as the photosensitive material, as long as hydrogen ions can be generated under irradiation with light of a preset wavelength and can be combined with carboxylate radicals.

In some embodiments, in the process of manufacturing the above first quantum dot portion, the second quantum dot portion and the third quantum dot portion which emit light of different colors, in a case that the same photosensitive material is adopted, then the quantum dot reserved area can be irradiated with light of the same preset wavelength, and the reserved area can also be irradiated with light of different preset wavelengths. In a case that different photosensitive materials are adopted, then the structures of the photosensitive materials correspondingly used by the three quantum dot layers are different, the reserved areas can be irradiated with light of different preset wavelengths, which can be selected according to the structure of the photosensitive materials. In some embodiments, light of the same preset wavelength can also be selected, and selection can be made according to actual conditions, which is not limited in the present disclosure.

In some embodiments, in the above manufacturing process of the first quantum dot portion, the second quantum dot portion and the third quantum dot portion according to some embodiments of the disclosure, the first quantum dot reserved area, the second quantum dot reserved area and the third quantum dot reserved area can be irradiated with light of the same wavelength. In some embodiments, the first quantum dot reserved area can also be irradiated with H-line light to form the first quantum dot portion which emits red light, and the wavelength of the H line is 405 nm; the second quantum dot reserved area can be irradiated with I-line light to form the second quantum dot portion which emits green light, and the wavelength of the I line is 365 nm; and the third quantum dot reserved area can be irradiated with G-line light to form the third quantum dot portion which emits blue light, and the wavelength of the G line is 436 nm.

Based on the same disclosed concept, embodiments of the present disclosure further provide a manufacturing method of a light emitting device, including manufacturing an anode, a quantum dot layer and a cathode, wherein the quantum dot layer is formed through the above method for patterning the quantum dot layer.

Figure 7:
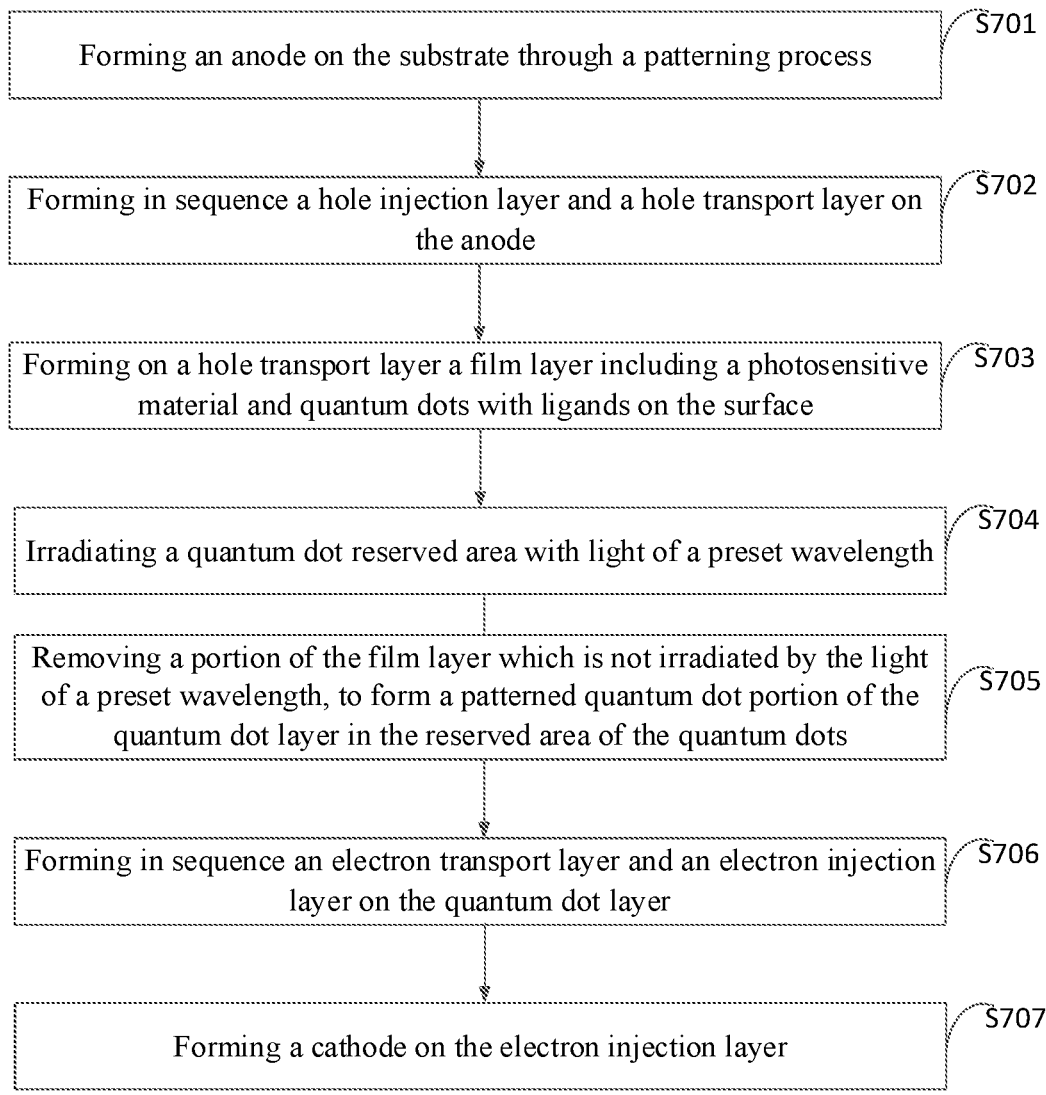
FIG. 7 is a flow chart of a manufacturing method of a light emitting device according to some embodiments of the disclosure.

In some embodiments, the light emitting device can have a conventional structure or an inverted structure. Taking the light emitting device having a conventional structure as an example, as shown in FIG. 7, the method of forming the light emitting device can include:

S701, forming an anode on the substrate through a patterning process;

S702, forming in sequence a hole injection layer and a hole transport layer on the anode;

S703, forming, on a hole transport layer, a film layer including a photosensitive material and quantum dots with ligands on the surface;

S704, irradiating a quantum dot reserved area with light of a preset wavelength; wherein under irradiation with light of a preset wavelength, the photosensitive material or a product of the photosensitive material after light irradiation reacts with the ligand on the surface of the quantum dots, such that the ligand falls off from the surface of the quantum dots, to change the solubility of the quantum dots, and cause the quantum dots to undergo coagulation;

S705, removing the portion of the film layer which is not irradiated by the light of a preset wavelength, to form a patterned quantum dot portion of the quantum dot layer in the quantum dot reserved area;

S706, forming, on the quantum dot layer, in sequence an electron transport layer and an electron injection layer; and S707, forming a cathode on the electron injection layer.

In some embodiments, to enable the well-manufactured quantum dot light emitting device to have a favorable light emitting performance, before forming on a hole transport layer a film layer including a photosensitive material and quantum dots with ligands on the surface, the above manufacturing method of light emitting devices further includes: forming an electron barrier layer on the hole transport layer.

In some embodiments, before forming an electron transport layer on the quantum dot layer, the above manufacturing method further includes: forming a hole barrier layer on the quantum dot layer.

In some embodiments, the manufacturing methods of the electron barrier layer and the hole barrier layer are the same as those in the related art, and will not be repeated redundantly herein.

In some embodiments, the methods of the above steps S701, S702, S706 and S707 provided in embodiments of the present disclosure are the same as those in the related art, and will not be repeated herein. The above steps S703, S704 and S705 are similar to the above steps S101, S102 and S103, and will not be repeated herein.

In some embodiments, the substrate provided in the embodiments of the present disclosure can include a base plate, a drive circuit on the base plate, and a passivation layer and a polarization layer above the drive circuit and other structures.

In some embodiments, after a cathode is manufactured, a packaging process, a cutting process and a bonding process of the quantum dot light emitting device are further included. These processes are the same as those in the related art, and will not be repeated redundantly herein.

Figure 8:
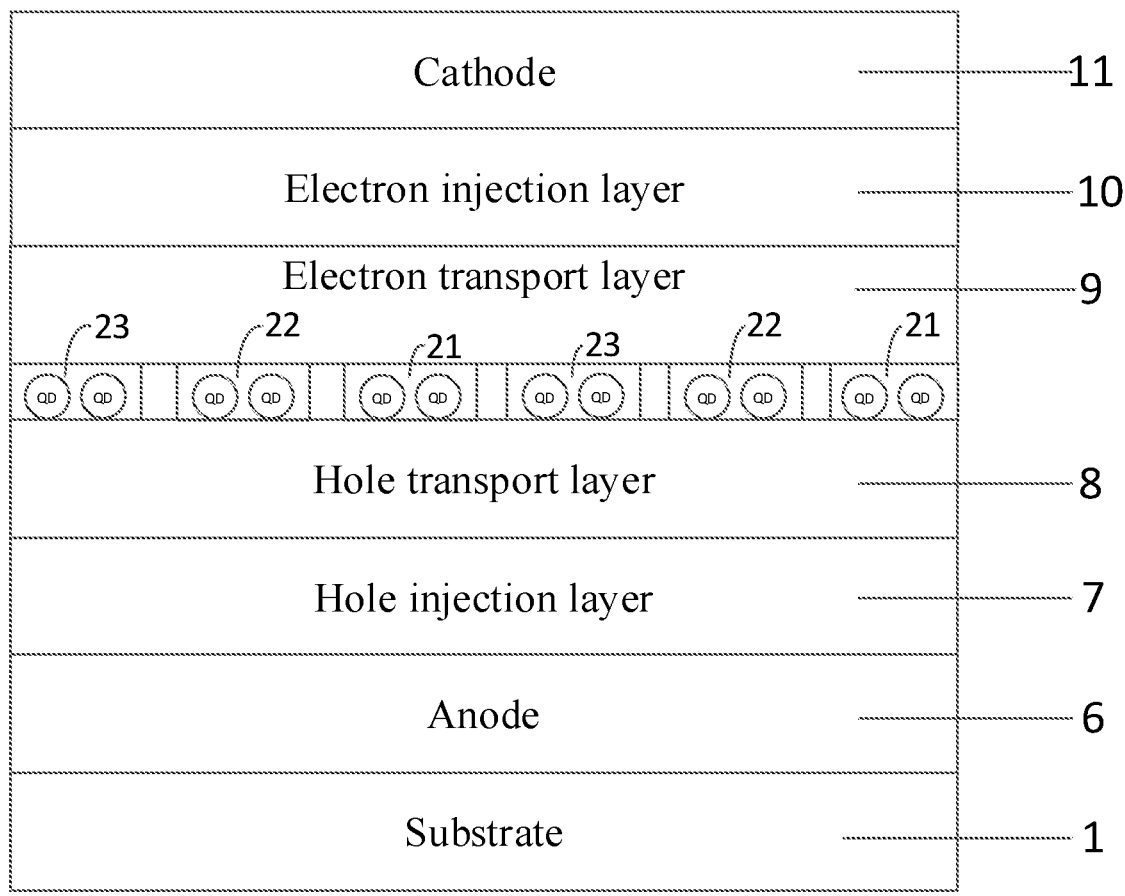
FIG. 8 is a structural schematic diagram of quantum dot light emitting devices according to some embodiments of the disclosure.

The manufacturing method of a light emitting device having a conventional structure provided in the embodiments of the present disclosure will be described simply in combination with FIG. 8 below.

In some embodiments, before forming an anode 6, the plasma is adopted to process the surface of the substrate 1.

In some embodiments, an anode 6 is manufactured on the substrate 1 through a patterning process. In some embodiments, the manufacturing method of the anode 6 is the same as that in the related art, and will not be described in detail herein.

In some embodiments, a hole injection layer 7 is formed on the anode 6 through a spin coating process, a hole transport layer 8 is formed on the hole injection layer 7 through a spin coating process. The material of the hole injection layer 7 can be PEDOT:PSS and the like, the material of the hole transport layer 8 can be TFB and the like. The overall thickness of the hole injection layer 7 and the hole transport layer 8 can be 50 nm-100 nm. The manufacturing methods of the hole injection layer 7 and the hole transport layer 8 can be the same as those in the related art, and will not be described in detail herein.

In some embodiments, a quantum dot layer including a first quantum dot portion 21, a second quantum dot portion 22 and a third quantum dot portion 23 is formed on the hole transport layer 8 by utilizing the above method for patterning the quantum dot layer.

In some embodiments, an electron transport layer 9 and an electron injection layer 10 are formed in sequence on the quantum dot layer through a spin coating or evaporation process, the material of the electron transport layer 9 can be ZnO nanoparticles, and the material of the electron injection layer 10 can be LiF and the like.

In some embodiments, a cathode 11 is evaporated on the electron injection layer 10, the material of the cathode can be LiF:Al and the like, and the thickness of the cathode can be 500 nm-1000 nm. The manufacturing methods of the electron transport layer 9, the electron injection layer 10 and the cathode 11 are the same as those in the related art, and will not be described in detail herein.

It should be noted that, in the embodiments of the present disclosure, the manufacturing method is described with the light emitting device having a conventional structure as an example. When the light emitting device has an inverted structure, the difference with the manufacturing of the conventional structure lies in that in an inverted structure, a cathode, an electron injection layer, an electron transport layer, a hole barrier layer, a light emitting layer, an electron barrier layer, a hole transport layer, a hole injection layer and an anode are formed in sequence on the substrate, which is not described in detail herein.

Based on the same inventive concept, embodiments of the present disclosure further provide a quantum dot light emitting device, including an anode, a quantum dot layer and a cathode which are disposed in a laminated manner, where the quantum dot layer includes a patterned quantum dot portion. In some embodiments, the percentage of the mass of the ligands on the surfaces of the quantum dots in the patterned quantum dot portion to the total mass of the patterned quantum dot portion is less than 10%. In some embodiments, the quantum dot layer in the quantum dot light emitting device is manufactured through the above patterning method of the quantum dot layer. Since when the patterned quantum dot portion of the quantum dot layer is formed, the ligand on the surface of the quantum dot reacts with the photosensitive material and falls off from the surface of the quantum dot, the number of the ligands on the surface of the quantum dot is greatly reduced, then the solubility of the quantum dots is changed, such that the quantum dots are coagulated, to realize patterning of the quantum dot layer. The inventor of the present disclosure has found through research that, before the ligand falls off by photosensitive material being combined with the ligand on the surface of the quantum dot, that is, the percentage of the mass of the ligands on the surface of the quantum dots to the total mass of the film layer is generally about 20%. After the ligand on the surface of the quantum dot falls off, the percentage of the mass of the ligands on the surfaces of the quantum dots in the quantum dot portion to the total mass of the quantum dot portion is less than 10%. Thus, the more quantum dots can be coagulated and not dissolved in the original solvent.

Based on the same inventive concept, embodiments of the present disclosure further provide a display device, including the above quantum dot light emitting device according to some embodiments of the disclosure.

In some embodiments, the above display device provided in the embodiments of the present disclosure can be: a mobile phone, a tablet personal computer, a television, a display, a notebook computer, a digital photo frame, a navigator and any other products or parts with a display function. The other essential components of the display device should be understood by those skilled in the art and are not repeated redundantly herein, and should not be taken as a limitation to the present disclosure. For the implementation of the display device, please refer to the above embodiments of the quantum dot light emitting devices, and the repeated parts will not be repeated redundantly herein.

In some embodiments, the display device according to some embodiments of the disclosure can further include other functional film layers which are well known to those skilled in the art, which will not be described in detail herein.

Embodiments of the present disclosure provide a method for patterning a quantum dot layer, a method for manufacturing a light emitting device, and related devices. In the present disclosure, firstly a film layer including a photosensitive material and quantum dots with ligands on the surface is formed on the substrate; then a quantum dot reserved area is irradiated with light of a preset wavelength; since under irradiation with light of a preset wavelength, the photosensitive material or a product of the photosensitive material after light irradiation reacts with the ligand on the surface of the quantum dot, the ligand falls off from the surface of the quantum dot, the solubility of the quantum dots without ligands is changed, such that the quantum dots are coagulated, and the quantum dots can no longer be dissolved in the original solvent; and finally, the film layer which is not irradiated by the light of a preset wavelength is removed to form a patterned quantum dot portion of the quantum dot layer in the quantum dot reserved area, i.e., the patterning of the quantum dot layer is completed. As such, the patterning of the quantum dot layer can be completed without adopting ink-jet printing or photolithography, thereby forming quantum dots with high resolution and favorable performance.

Evidently, those skilled in the art can make various modifications and variations to the present disclosure without departing from the spirit and scope of the present disclosure. Accordingly, the present disclosure is also intended to encompass these modifications and variations thereto so long as the modifications and variations come into the scope of the claims appended to the disclosure and their equivalents.

What is claimed is:

1. A method for patterning a quantum dot layer, comprising:
    forming, on a substrate, a film layer including a photosensitive material and quantum dots with ligands on surfaces of the quantum dots;
    irradiating a quantum dot reserved area on the substrate with light; wherein under irradiation with the light, the photosensitive material or a product of the photosensitive material after light irradiation reacts with the ligands on the surfaces of the quantum dots, to allow the ligands to fall off from the surfaces of the quantum dots, so that solubility of the quantum dots is changed to cause the quantum dots to undergo coagulation; wherein the quantum dot reserved area is an area where a patterned quantum dot portion of the quantum dot layer is to be formed on the substrate; and
    removing a portion of the film layer which is not irradiated by the light, to form the patterned quantum dot portion of the quantum dot layer in the quantum dot reserved area;
    wherein the forming on the substrate the film layer including the photosensitive material and quantum dots with ligands on the surfaces of the quantum dots comprises:
    mixing the photosensitive material and the quantum dots with ligands to form a mixed solution; and
    coating the mixed solution on the substrate to form the film layer;
    wherein the photosensitive material comprises at least one of photo-acid generators, olefins or alkynes;
    and a mass of the photo-acid generator accounts for 1%-20% of a mass of the mixed solution, and a mass of the olefins or alkynes is 1-20 times the mass of the mixed solution.

2. The method according to claim 1, wherein the irradiating the quantum dot reserved area on the substrate with light comprises:
    irradiating the film layer by shielding the film layer with a mask;
    wherein the mask comprises a light-transmitting area and a light-shading area, and the light-transmitting area corresponds to the quantum dot reserved area.

3. The method according to claim 1, wherein the removing the portion of the film layer which is not irradiated by the light comprises:
    cleaning the film layer after irradiation with solvent;
    wherein quantum dots in an area not irradiated by the light in the film layer are dissolved in the solvent, and quantum dots coagulated in the quantum dot reserved area are not dissolved in the solvent.

4. The method according to claim 1, further comprising: drying and annealing the quantum dot layer.

5. A manufacturing method of a light emitting device, comprising: forming an anode, a quantum dot layer and a cathode;
    wherein, the quantum dot layer is prepared according to the method according to claim 1.

6. The manufacturing method according to claim 5, wherein a percentage of a mass of the ligands on the surfaces of the quantum dots in the patterned quantum dot portion to a total mass of the patterned quantum dot portion is less than 10%.

* * * * *